United States Patent
Ray et al.

(10) Patent No.: US 7,094,503 B2
(45) Date of Patent: Aug. 22, 2006

(54) NANOPASTES FOR USE AS PATTERNING COMPOSITIONS

(75) Inventors: Kevin Barry Ray, Fort Collins, CO (US); Ken-Ichi Shimazu, Briarcliff Manor, NY (US); Anthony Paul Kitson, Evans, CO (US)

(73) Assignee: Kodak Graphics Communications Canada Company, Barnaby (CA)

( * ) Notice: Subject to any disclaimer, the term of this patent is extended or adjusted under 35 U.S.C. 154(b) by 291 days.

(21) Appl. No.: 10/400,715

(22) Filed: Mar. 27, 2003

(65) Prior Publication Data

US 2004/0191640 A1     Sep. 30, 2004

(51) Int. Cl.
  *G03F 9/00*      (2006.01)
  *G03C 5/00*      (2006.01)

(52) U.S. Cl. .............. 430/5; 430/270.1; 430/271.1; 430/275.1; 430/300; 430/302; 430/330

(58) Field of Classification Search .............. 430/5, 430/270.1, 271.1, 275.1, 300, 302, 330
See application file for complete search history.

(56) References Cited

U.S. PATENT DOCUMENTS

| | | | |
|---|---|---|---|
| 5,698,360 A | 12/1997 | Timpe et al. ........... | 430/175 |
| 5,700,619 A | 12/1997 | Baumann et al. ........... | 430/175 |
| 5,738,013 A | 4/1998 | Kellett ............... | 101/463.1 |
| 5,925,491 A | 7/1999 | Baumann et al. ........... | 430/175 |
| 6,341,560 B1 | 1/2002 | Shah et al. ............. | 101/463.1 |
| 6,359,056 B1 | 3/2002 | Aurenty et al. ............ | 524/556 |
| 6,432,526 B1 | 8/2002 | Arney et al. ............. | 428/328 |
| 2004/0191641 A1 | 9/2004 | Ray et al. | |
| 2004/0191695 A1 | 9/2004 | Ray et al. | |

FOREIGN PATENT DOCUMENTS

| | | |
|---|---|---|
| EP | 1 120 247 | 8/2001 |
| EP | 1 157 825 | 11/2001 |
| EP | 1 157 826 | 11/2001 |
| EP | 1 157 827 | 11/2001 |
| EP | 1 157 828 | 11/2001 |
| EP | 1 211 063 | 6/2002 |
| WO | WO 95/23244 | 8/1995 |
| WO | WO 00/37254 | 6/2000 |
| WO | WO 01/11426 | 2/2001 |
| WO | WO 01/54915 | 8/2001 |
| WO | WO 02/47447 | 6/2002 |

*Primary Examiner*—Christopher G. Young
(74) *Attorney, Agent, or Firm*—J. Lanny Tucker

(57) ABSTRACT

The present invention provides a patterned substrate and methods of forming patterns on a substrate, in which a thermally sensitive composition composed of an inorganic nanopaste is applied onto a surface of a substrate to form a layer. The layer may be imaged and developed to form a pattern area that adheres to the surface of the substrate. The patterned substrate may be used in the production of printing plates and masks.

87 Claims, No Drawings

NANOPASTES FOR USE AS PATTERNING COMPOSITIONS

BACKGROUND OF THE INVENTION

The art of lithographic printing is based on the immiscibility of ink and water. A lithographic printing plate is composed of ink receptive regions, commonly referred to as the "image area," generated on a hydrophilic surface of a substrate. When the surface of the printing plate is moistened with water and printing ink is applied, revealed portions of the hydrophilic surface retain the water and repel the printing ink, and the oleophilic image area accepts the printing ink and repels the water. The printing ink retained on the oleophilic image area may then be transferred to the surface of a material upon which the image is to be reproduced. Typically, the ink is first transferred to an intermediate blanket, which in turn transfers the ink to the desired surface.

Lithographic printing plates typically comprise a radiation-sensitive coating applied over the hydrophilic surface of a substrate. Conventional radiation-sensitive coatings include photosensitive components dispersed within an organic polymeric binder. After a portion of the coating is exposed to radiation (commonly referred to as imagewise exposure), the exposed portion becomes either more soluble or less soluble in a developer than an unexposed portion of the coating. A printing plate is generally considered a positive-working plate if, after exposure to radiation, the exposed regions or areas of the radiation-sensitive coating become more soluble and are removed in the developing process to reveal the hydrophilic surface. Conversely, if the exposed regions or areas become less soluble in the developer and the unexposed regions or areas are removed in the developing process, the plate is considered a negative-working plate. In each instance, the undeveloped areas that remain on the plate provide an ink-receptive image, while the revealed regions of the substrate's hydrophilic surface repel ink.

High demands are placed on radiation-sensitive coatings used for printing plates. Heretofore, two avenues have been taken to improve the properties of these coatings. The first avenue concentrates on improving the properties of the photosensitive components of the coatings. The second avenue involves improving the properties of the polymeric binder that controls the physical and mechanical properties of the coating. The latter avenue has been the source of significant research and innovation because the behavior of radiation-sensitive coatings in the imaging, developing and printing processes, as well as the shelf life and durability of the printing plate are heavily influenced by the choice of binder material.

These polymeric binders include various substituents having differing effects on the physical and mechanical properties of the binder. For example, hydrophilic structural elements such as carboxyl groups, hydroxyl groups, etc., generally promote good developability of the photosensitive compositions in aqueous-alkaline developers and contribute to adequate adhesion to traditional substrates. On the other hand, hydrophobic structural elements hinder the developability in common developers, but ensure good acceptance of the ink in the printing process, which is absolutely essential for printing plates.

Given the broad spectrum of requirements for polymer binders, there has been much work on the synthesis and optimization of the use of these binders for photosensitive compositions, see for example, H. Baumann and H. J. Timpe, Chemical Aspects of Offset Printing, J. prakt. Chem./Chemiker-Zeitung, Vol. 336, pgs. 377–89 (1994). Below is a summary of numerous types of previously reported polymer binders. As noted, each of these binder types suffer from some drawback resulting from the need to balance the broad spectrum of desired properties required for printing plates, including adherence to the substrate, durability, photosensitivity, developability, and ink-receptiveness.

U.S. Pat. Nos. 4,511,640 and 4,618,562 and U.S. Pat. No. 4,731,316, report binder systems which are composed of mixtures of various polymers, possessing different hydrophilic/hydrophobic properties. These mixtures have drawbacks in that separation of the mixture often occurs during the coating process. Furthermore, separation of the hydrophobic polymers in the development step may result in silting in the development machines and redeposition of dispersed elements of the coating on the surface of the photosensitive material.

Moreover, various copolymers containing monomer units having low hydrophilic properties, such as styrene, acrylate, methacrylate, etc., combined with more hydrophilic comonomers have been reported. Examples of such comonomers are semi-esters of maleic acid (Canadian Patent 1 172 492 and U.S. Pat. No. 4,687,727), itaconic acid (U.S. Pat. No. 5,260,161), and acrylic acid or methacrylic acid (European Patent EP-A-487 343, U.S. Pat. Nos. 4,304,832 and 4,123,276). The drawback of such copolymers is the potentially narrow margin of applicability for properties such as film adhesion, developability, ink acceptance, and plate life.

U.S. Pat. No. 4,177,073 reports a photosensitive composition in which the binder is a reaction product of cellulose esters with cyclical, intramolecular acid anhydrides of dicarboxylic acids. However, these binders may not be sufficiently oleophilic for use in printing plate formulations. Furthermore, their printing plate life may not meet the demands of a modem printing plate.

Acetals of aliphatic aldehydes with unsubstituted lower alkyl group and vinyl alcohol/vinyl acetate copolymers have been reported (U.S. Pat. No. 2,179,051 and U.S. Pat. No. 4,665,124). But such binders may cause problems during the development of printing plates due to an insufficient proportion of hydrophilic groups in the polymer. As an improvement, partially acetalized vinyl alcohol/vinyl acetate copolymers have been provided with hydrophilic or alkaline-soluble groups by additional reactions. U.S. Pat. No. 4,940,646 reports aldehyde-containing hydroxyl groups that are used for the acetalization, besides aldehydes with hydrophobic groups (e.g., alkyl or aryl groups). Yet this structural change may not result in a distinct improvement in developability.

In order to improve developability, sulfonyl urethane groups were introduced into polyvinyl acetals as reported in U.S. Pat. Nos. 3,372,105 and 3,732,106 and 4,387,151. However, the low acidity of these groups requires developers with a large amount of solvent. Furthermore, the microelements of the resulting printing plate may have poor adhesion and may be easily abraded in the printing process.

UK Patent GB 1 396 355 and U.S. Pat. No. 3,847,614, reports binders which may be produced by acetalization of saponified copolymers of vinyl acetate and a carboxyl group-carrying monomer, such as crotonic acid. However, this type of binder may result in systems with poor photo-sensitivity and short printing plate life. Moreover, such compositions may be poorly developable in aqueous-alkaline developers, because the acid number of the binder is greatly decreased by chemical reactions of the carboxyl group during the saponification and/or acetalization process.

U.S. Pat. Nos. 5,045,429 and 4,681,245, report compositions including carboxyl groups formed by reacting acetals, which have been separately produced from aliphatic aldehydes and polyvinyl alcohol, with intramolecular cyclical acid anhydrides of dicarboxylic acids. However, the synthesis may be costly because the reaction of the acid anhydrides is only possible in aprotic solvents. Furthermore, the photosensitivity of the compositions prepared from this type of binder may be too low.

U.S. Pat. No. 4,741,985 reports binders produced in a three-stage synthesis, starting with polyvinyl alcohol. The first stage is acetalization with aliphatic aldehydes. The second stage is reaction with intramolecular cyclical acid anhydrides of dicarboxylic acids. The third stage is partial esterification of the carboxyl groups with substituted alkyl halides. Despite the high expense in the synthesis of this binder material, the photosensitivity of the resulting film may be inadequate.

The expense of a multi-stage synthesis may be avoided if, as reported in U.S. Pat. Nos. 5,219,699, 4,652,604, 4,895,788, 4,940,646 and 5,169,897, polyvinyl alcohol is reacted with aliphatic aldehydes and carboxyl-containing aliphatic or carboxyl-containing aromatic aldehydes. However, the photosensitive compositions prepared from this may not be suitably radiation-sensitive or developable.

Mixtures of polyvinyl acetals and organic polymers, which possess an acid number greater than 71 mg KOH/g have also been reported in U.S. Pat. No. 5,143,813. However, separation of the mixture from the substrate can occur during lamination or drying of the photosensitive compositions.

Thus, despite the significant amount of effort spent developing improved organic polymeric binders, reported binders tend to suffer from one or more drawbacks. As noted above, certain types of polymeric binders lack suitable adherence to substrates. Other polymeric binders lack suitable photosensitivity under conventional imaging conditions. Still other polymer binders have difficulty withstanding the extended exposure/development steps required in the production of certain printing plates, for example, flexographic printing plates. Further certain polymer binders have barely sufficient developer resistance after imaging, particularly IR imaging. Further yet, certain polymer binders have low resistance to the mechanical stress that plates are subjected to, as well as the chemicals used to clean and treat finished plates. Additionally, many of the polymer binders must be dissolved in organic solvents during manufacturing of the printing plate. Many organic solvents are being subjected to increased regulation due to environmental considerations.

SUMMARY OF THE INVENTION

In one embodiment, the present invention provides a mask or printing plate precursor composed of a substrate and a thermally sensitive composition including inorganic nanoparticles applied onto a surface of the substrate. As used herein, the phrase "thermally sensitive composition," refers to compositions in which, upon imagewise exposure to thermal radiation, exposed portions of the composition have a different solubility in a developer than unexposed portions of the composition.

The substrate may be hydrophilic or oleophilic, depending on the desired application. The substrate may be composed of a metal such as aluminum, a polymeric material, a ceramic material, a stiff paper, or a laminate of materials.

The inorganic nanoparticles generally have an average diameter of less than about 50 nm, more particularly less than about 25 nm and even more particularly less than about 15 nm. In one embodiment, the inorganic nanoparticles are composed of metals, such as silver, palladium or combinations thereof. The thermally sensitive composition may optionally include additional components, such as dispersing agents, radiation absorbers (e.g. radiation-absorbing dyes or pigments), binders, surfactants, humectants, biocides, viscosity builders, colorants, pH adjusters, drying agents, defoamers or combinations thereof.

In another embodiment, the present invention comprises a method of forming an image on a substrate, in which a thermally sensitive composition including a nanopaste is applied onto a surface of a substrate. The layer may then be treated to form a solid layer that adheres to the substrate. The layer is then imagewise exposed to radiation to affect the solubility of exposed portions or areas of the layer relative to unexposed portions or areas of the layer. The imaged layer is then developed to remove either the exposed or unexposed portions of the layer to form an image area. This process may be particularly useful in the formation of image areas on printing plates and masks.

As used herein, the term "nanopaste" refers to a mixture or sol composed of inorganic nanoparticles dispersed in a carrier. Suitable carriers depend on the specific composition and the desired application, but generally include, organic carriers, aqueous carriers and mixtures of organic and aqueous liquids. In certain embodiments, the nanopaste is an inorganic nanopaste including inorganic nanoparticles in a substantially aqueous carrier. In these embodiments, the carrier may be composed of water or mixtures of water with water-miscible organic solvents such as suitable alcohols.

The inorganic nanoparticles may form a stable dispersion in the carrier at room temperature. Furthermore, the inorganic nanoparticles are of such a size that the viscosity of the dispersion is surprisingly low. This property, in part, allows for a high concentration of inorganic nanoparticles to be included in the nanopaste without adversely affecting the application of the nanopaste to a substrate. In one embodiment, the inorganic nanoparticles compose between about 0.5 and about 75 w/w % of the nanopaste.

The nanopaste may optionally include additional components, such as dispersing agents, binders, surfactants, humectants, biocides, viscosity builders, colorants, pH adjusters, drying agents, defoamers or combinations thereof.

In a further embodiment, the present invention provides a method of making a printing plate precursor, in which a thermally sensitive composition including a nanopaste applied onto a surface of a substrate. The thermally sensitive composition is then treated by air or oven drying to form a layer that adheres to the substrate. The resulting layer may then be imagewise exposed to radiation to affect the solubility of exposed portions of the layer relative to unexposed portions of the layer. The imaged layer may then developed to remove either the exposed or unexposed portions of the layer to form an image area. The resulting image area may then be immersed in a suitable conditioner to enhance the ink-receptive properties of the image area.

In yet a further embodiment, the present invention provides a method of making a mask precursor. A thermally sensitive composition including a nanopaste is applied to a surface of a substrate. Generally, the composition is applied onto a transparent substrate (e.g. a polyester substrate), or a photopolymerisable layer of a flexographic printing element. The thermally sensitive composition is then treated with air or oven drying to form a layer that adheres to the substrate. The layer is then imagewise exposed to radiation to affect the solubility of exposed portions of the layer relative to unexposed portions of the layer. The imaged layer is then developed to remove either the exposed or unexposed portions of the layer to form a radiation opaque image area on the transparent substrate. The resulting mask may have an optical density of at least 2.0, more particularly at least 2.5, even more particularly, between 2.5 and 3.0.

The thermally sensitive composition has several characteristics making it particularly suitable for use in printing plate and mask applications. First, the inorganic nanoparticles may dispersed in substantially aqueous carriers and do not necessarily need to be soluble or dispersible in substantially organic carriers. Additionally, the inorganic nanoparticles are sized such that application of the composition to a substrate may be performed by conventional methods. Further, the nanopaste adheres well to a variety of substrates. Further yet, the nanopaste has suitable photosensitivity and solubility in suitable developers to form high quality image areas. Also, the inorganic nanopaste may form a durable image with a long life. The inorganic nanopaste also has suitable optical density for use as a mask, but may also be treated to enhance the ink receptiveness of the image for use in printing plates.

DETAILED DESCRIPTION

The present invention provides methods of forming image areas on a substrate for a variety of applications, including lithographic printing plates and masks. In one embodiment, an image area is formed on a substrate by applying a thermally sensitive composition composed of a nanopaste onto the substrate and then treating the thermally sensitive composition (e.g., air or oven drying) to form a layer. The layer is then imaged and developed to form an image area.

Suitable substrates for the present invention may vary widely depending upon the desired application and the specific composition employed. Suitable substrates or substrate surfaces may be hydrophilic or oleophilic, and may be composed of metals, polymers, ceramics, stiff papers, or laminates or composites of these materials. Suitable metal supports include aluminum, zinc, titanium and alloys thereof. In one embodiment, the substrate includes aluminum, which may be treated by graining and anodizing and may then be conditioned to produce a hydrophilic surface. Suitable polymeric supports include polyethylene terephthalate films, polyester, epoxy laminates an photopolymerisable layers of flexographic printing precursors. Such polymeric supports may be coated with hydrophilicity-enhancing components, including alkoxysilanes, aminopropyltriethoxysilane, glycidoxypropyltriethoxysilane and epoxy functional polymers, as well as conventional coating materials used on polyester bases in photographic films. The substrate may be of sufficient thickness to sustain the wear from printing or other desired applications, and be thin enough to wrap around a printing form, typically from about 100 to about 600 μm.

Specific examples of suitable substrates and substrate treatments are provided in Table 1 below:

TABLE 1

| SUBSTRATE | SURFACE TREATMENT | INTERLAYER TREATMENT |
| --- | --- | --- |
| AA | Quartz Grained and Anodized | None |
| EG-PVPA | Electrograined and Anodized | Polyvinyl phosphoric acid |
| PF | Electrograined and Anodized | Sodium dihydrogen phosphate/Sodium fluoride |
| G20 | Electrograined and Anodized | Vinylphosphonic acid/acrylamide copolymer |
| EG-Sil | Electrograined and Anodized | Sodium Silicate |

TABLE 1-continued

| SUBSTRATE | SURFACE TREATMENT | INTERLAYER TREATMENT |
| --- | --- | --- |
| DS-Sil | Chemically Grained and Anodized | Sodium Silicate |
| PG-Sil | Pumice Grained and Anodized | Sodium Silicate |
| CHB-Sil | Chemically Grained, Anodized and Silicated | Sodium Silicate |

In Table 1 above, the abbreviation "AA" refers to "as anodized." An aluminum surface is quartz grained and then anodized using DC current of about 8 A/cm$^2$ for 30 seconds in a $H_2SO_4$ solution (280 g/liter) at 30° C.

"EG" means "electrolytic graining." The aluminum surface is first degreased, etched and subjected to a desmut step (removal of reaction products of aluminum and the etchant). The plate is then electrolytically grained using an AC current of 30–60 A/cm$^2$ in a HCl solution (10 g/liter) for 30 seconds at 25° C., followed by a post-etching alkaline wash and a desmut step. The grained plate is then anodized using DC current of about 8 A/cm$^2$ for 30 seconds in a $H_2SO_4$ solution (280 g/liter) at 30° C.

"PVPA" is a polyvinylphosphonic acid. A plate is immersed in a PVPA solution and then washed with deionized water and dried at room temperature.

"PF" means that the substrate has a phosphate fluoride interlayer. The process solution contains sodium dihydrogen phosphate and sodium fluoride. An anodized substrate is treated in the solution at 70° C. for a dwell time of 60 seconds, followed by a water rinse and drying. The sodium dihydrogen phosphate and sodium fluoride are deposited as a layer to provide a surface coverage of about 500 mg/m$^2$.

"G20" is a printing plate substrate described in U.S. Pat. No. 5,368,974, which is incorporated herein by reference.

"Sil" means that an anodized plate is immersed in a sodium silicate solution to coat it with an interlayer. The coated plate is then rinsed with deionized water and dried at room temperature.

"DS" means "double sided smooth." As aluminum oxide plate is degreased, etched or chemically grained, and subjected to a desmut step. The smooth plate is then anodized.

"PG" means "pumice grained." The surface of an aluminum substrate is degreased, etched and subjected to a desmut step. The plate is then mechanically grained by subjecting it to a 30% pumice slurry at 30° C., followed by a post-etching step and desmut step. The grained plate is then anodized using DC current of about 8 A/cm$^2$ for 30 seconds in a $H_2SO_4$ solution (280 g/liter) at 30° C. The anodized plate is then coated with an interlayer of, for example, sodium silicate.

"CHB" means chemical graining in a basic solution. After an aluminum substrate is subjected to a matte finishing process, a solution of 50 to 100 g/liter NaOH is used during graining at 50° C. to 70° C. for 1 minute. The grained plate is then anodized using DC current of about 8 A/cm$^2$ for 30 seconds in a $H_2SO_4$ solution (280 g/liter) at 30° C. The anodized plate is then coated with a silicated interlayer.

The nanopaste of the present invention may be composed of inorganic nanoparticles and a carrier. Examples of suitable inorganic nanoparticles include metal nanoparticles composed of silver, palladium, gold, platinum, nickel, copper or mixtures or alloys of these materials. The inorganic nanoparticles are generally formed by gas evaporation or other known methods, and have an average diameter of less than 50 nm, more particularly less than 25 nm and even more particularly less than 15 nm.

Suitable carriers for use in the nanopaste of the present invention may include aqueous carriers, organic carriers and mixtures of aqueous and organic liquids. In one embodiment, the nanopaste is an inorganic nanopaste composed of inorganic nanoparticles in a substantially aqueous carrier. As used herein, the phrase "substantially aqueous carrier," refers to carriers containing greater than about 50 v/v % water. Examples of suitable substantially aqueous carriers include solutions of 100 v/v % water and mixtures of water and water-miscible organic liquids such as alcohols.

Specific examples of the nanopastes described herein include a silver/palladium sol having a metallic particle average diameter of 11.1 nm supplied in a 5 w/w % solution in water by ANP, Kumho-ri, Buyong-nyeon, Chungwon-Kun, Chungcheongbukdo, Korea. Another example is a silver sol having a metallic particle average diameter of 11.0 nm supplied in a 5 w/w % solution in water by ANP.

At room temperature, the nanopaste acts as a stable aqueous dispersion in a desired carrier. Due, in part, to the small size of the inorganic nanoparticles, a relatively large inorganic nanoparticle concentration may be used in the nanopaste while still maintaining a suitable viscosity for application onto a substrate. In one embodiment, the nanopaste may be composed of between about 0.5 and about 75 w/w % inorganic nanoparticles. In another embodiment, the nanopaste may be composed of between about 0.5 and about 25 w/w % inorganic nanoparticles. In yet another embodiment, the nanopaste may be composed of between about 0.5 and about 10 w/w % inorganic nanoparticles.

Optionally, the nanopaste may also include a surfactant or other suitable dispersing agent to promote a stable dispersion of the inorganic nanoparticles in the carrier and/or to improve the resolution of the image area. Examples of suitable dispersing agents include cationic, anionic, amphoteric and non-ionic surfactants. Specific examples include perfluoroalkyl, alkylphenyl, or polysiloxane surfactants. Suitable polysiloxane surfactants include polyether/polysiloxane copolymer, alkyl-aryl modified methyl-polysiloxane and acylated polysiloxane. Other suitable surfactants include sorbitan tristearate, sorbitan monopalmitate, sorbitan triolate, mono glyceride stearate, polyoxyethylene nonylphenyl ether, alkyl di (aminoethyl) glycine, alkyl polyaminoethylglycine hydrochloride, 2-alkyl-n-carboxyethyl-N-hydroxyethyl imidazolinium betaine, and N-tetradecyl-N,N-substituted betaine.

Additional surfactants include alkylated surfactants, fluorosurfactants and siliconated surfactants. Examples of these surfactants include sodium dodecylsulfate, isopropylamine salts of an alkylarylsulfonate, sodium dioctyl succinate, sodium methyl cocoyl taurate, dodecylbenzene sulfonate, alkyl ether phosphoric acid, N-dodecylamine, dicocoamine, 1-aminoethyl-2-alkylimidazoline, 1-hydroxyethyl-2-alkylimidazoline, cocoalkyl trimethyl quaternary ammonium chloride, polyethylene tricecyl ether phosphate and the like.

Examples of suitable fluorosurfactants also include ZONYL FSD, ZONYL FSA, ZONYL FSP, ZONYL FSJ, ZONYL FS-62, ZONYL FSK, ZONYL FSO, ZONYL FS-300, ZONYL FSN, and OLIN 10G, all of which are commercially available from E.I. Du Pont De Nemours & Co. Additional examples of suitable fluorosurfactants include FLUORAD FC-135, FLUORAD FC-129, FLUORAD FC-120, FLUORAD FC-100, FLUORAD FC-170C FLOURAD FC431 and FLUORAD FC-171, all of which are commercially available from 3M, St. Paul, Minn.

Further examples of suitable surfactants include polyether modified poly-dimethyl-siloxane, silicone glycol, polyether modified dimethyl-polysiloxane copolymer, and polyether-polyester modified hydroxy functional polydimethyl-siloxane.

Optionally, the nanopaste may also include polymeric binders, which may affect the physical and mechanical properties of the thermally sensitive composition. Suitable binders may be soluble or dispersible in the carrier used in a particular nanopaste. Such binders may be suitably soluble in organic carriers, aqueous carriers and/or mixtures of organic and aqueous solutions.

Examples of suitable binders include epoxy resins, modified epoxy resins, polyester resins, novolak resins, cellulosic materials, hydroxypropylcellulose, hydroxyethylcellulose, hydroxypropylmethylcellulose, carboxymethylcellulose, copolymers of vinylidene chloride and acrylonitrile, acrylic acid resins, polyvinyl resins, silicone resins, polyamide resins, vinyl alcohol resins, resol resins, acetal resins, polyacrylonitrile resins, formaldehyde resins, polycarbonate resins, polyimide resins, polyethyleneimine, poly(ethyloxazoline), gelatin, starches, dextrin, amylogen, gum arabic, agar, algin, carrageenan, fucoidan, laminaran, corn hull gum, gum ghatti, karaya gum, locust bean gum, pectin, guar gum and copolymers or derivatives thereof.

Additional examples may include epoxy resins produced by the condensation of epichlorohydrin and Bisphenol A or F, epoxy novolak resins, rubber modified epoxy resins, Bisphenol A based polyester resins, epoxydized o-cresylic novolaks, urethane modified epoxy resins, phosphate modified Bisphenol A epoxy resins, cellulose esters, copolymers of vinylidene chloride and acrylonitrile, poly(meth)acrylates, polyvinyl chloride, silicone resins, polyesters containing hydroxy or carboxy groups, polyamides comprising amino groups or carboxy groups, polymers and copolymers of vinyl alcohol, polyvinylimidazole, polyvinylpyrrolidone, polymers and copolymers of vinylphenol, acrylamide, methylol acrylamide, methylol methacrylamide, polyacrylic acid, methacrylic acid, hydroyethyl acrylate, hydroxethyl methacrylate, maleic anhydride/vinyl methyl ether copolymers, novolak resin, resol resin, polyvinyl phenol resin, copolymers of acrylic acid, polyacetal, poly(methyl methacrylate), polymethacrylic acid, polyacrylonitrile, cellulose acetate, cellulose acetate butyrate, cellulose acetate propionate, melamine formaldehyde resins, polycarbonates, polyimides and urea formaldehyde resins.

Optionally, the nanopaste may also include humectants, biocides, viscosity builders, colorants, pH adjusters, drying agents, defoamers or combinations thereof. Suitable humectants include ethylene glycol and sorbitol. Suitable biocides include Proxel GXL (supplied by Zeneca Corporation), Kathion X L (supplied by Rohm and Haas) and Triclosan (supplied by Ciba Specialty Chemicals). An example of a suitable viscosity builder includes polyethylene glycol.

The nanopaste of the present of the present invention may form a thermally sensitive composition. The thermally sensitive composition may include a radiation absorber. Radiation absorbers may absorb ultraviolet, visible, and/or infrared radiation and convert it to heat to affect the solubility of the thermally sensitive composition in a developer. The radiation absorber may be composed, for example, of a dye or pigment. In one embodiment, the radiation absorber may compose between about 0.25 to about 25 w/w % of the thermally sensitive composition. In embodiments in which the radiation absorber is a dye, the dye may compose between about 0.25 to about 15 w/w % of the thermally sensitive composition. In embodiments in which the radiation absorber is a pigment, the pigment may compose between about 5 to about 25 w/w % of the thermally sensitive composition.

Suitable radiation absorbers may be soluble or dispersible in the carrier selected for use in the nanopaste. Examples of suitable dyes and pigments include dye or pigment of the squarylium, merocyanine, indolizine, pyrylium, or metal diothiolene class. Examples of radiation absorbing pigments are Projet 900, Projet 860 and Projet 830 (all available from the Zeneca Corporation), and carbon black. Dyes, especially dyes with a high extinction coefficient in the range of 750 nm to 1200 nm, are suitable. Radiation absorbing dyes are disclosed in numerous publications, for example, Nagasaka, EP 0 823 327; Van Damme, EP 0 908 397; DeBoer, U.S. Pat. No. 4,973,572; Jandrue, U.S. Pat. No. 5,244,771; and Chapman, U.S. Pat. No. 5,401,618. Examples of useful absorbing dyes include, ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectraIR 830A and SpectraIR 840A (Spectra Colors).

In one embodiment, the radiation absorber may be soluble in substantially aqueous carriers. Examples of such dyes include IR Dyes A, B, C, D and E, the structures of which are provided below:

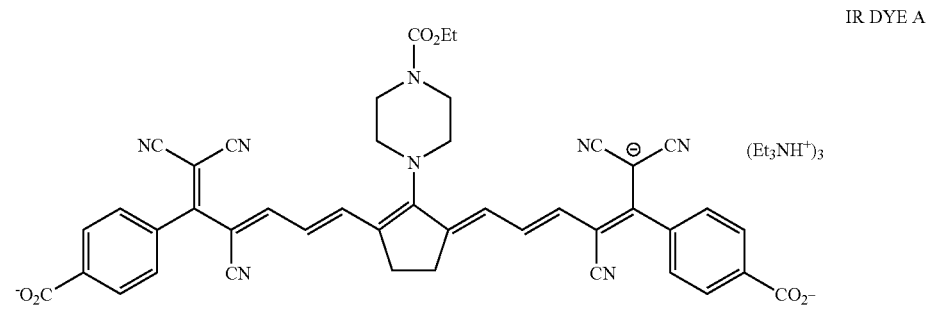

IR DYE A

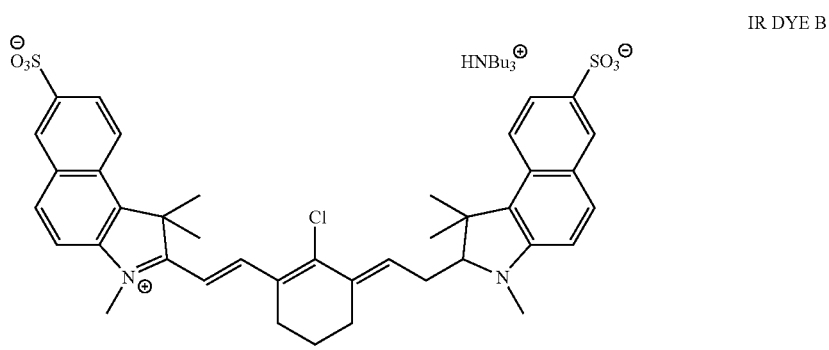

IR DYE B

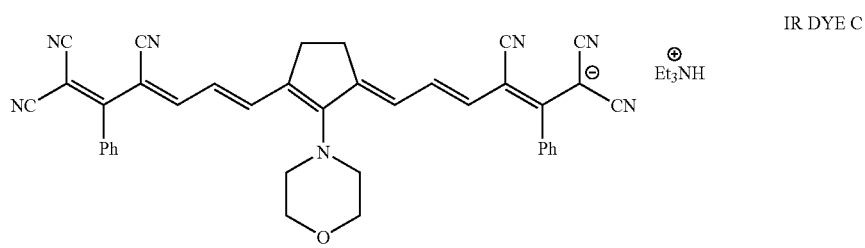

IR DYE C

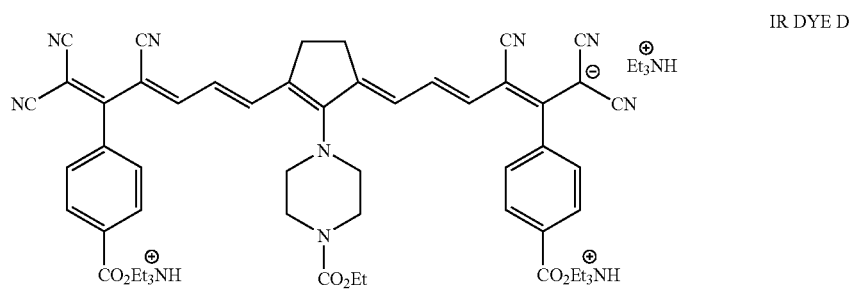

IR DYE D

-continued

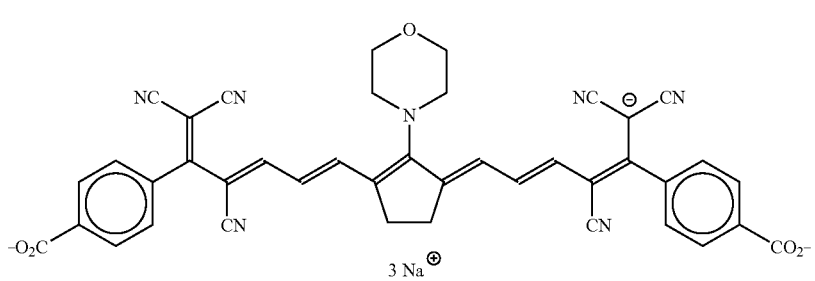

IR DYE E

The thermally sensitive composition may be applied to the surface of a suitable substrate by conventional methods, such as by spin coating, bar coating, gravure coating or roller coating. In one embodiment, for example, the thermally sensitive composition may be applied with a wire wound bar onto the substrate surface. The thermally sensitive composition may then be air dried, oven dried or radiation cured to form a layer that adheres to the substrate. For example, the layer may be heated in an oven at between about 50° C. and about 200° C. for between about 30 seconds and about two minutes. In another example, the layer may be heated at about 80° C. for about 1 minute. The treatment step may remove and/or evaporate portions of the carrier and certain optional components, such as the dispersing agent.

The layer may then be imagewise exposed to thermal radiation, particularly to IR radiation, to affect the solubility of the exposed portions of the layer, such that exposed portions of the layer have a different solubility in a developer than unexposed portions. An example of a suitable radiation source is the Creo Trendsetter 3230, which contains a laser diode that emits near infrared radiation at a wavelength of about 830 nm and is available from Creo Products Inc., Burnaby, BC, Canada. Another suitable radiation source is a Crescent 42T Platesetter, an internal drum platesetter that operates at a wavelength of 1064 nm (Gerber Scientific, South Windsor, Conn., USA).

Either the exposed or unexposed portions may then be developed in a suitable developer that can penetrate and remove desired portions of the layer to form an image area. Useful developers include aqueous solutions having a pH of about 7.0 or above. More particularly, the developer may have a pH between about 8 and about 13.5, or between about 12 and about 14. Examples of suitable developers include 956 developer (a phenoxyethanol based developer), 955 developer (a benzyl alcohol developer) and Goldstar developer (a sodium metasilicate developer), all available from Kodak Polychrome Graphics, Norwalk, Conn. Other suitable developers may include PC3000, PC955 and PC9000 also supplied by Kodak Polychrome Graphics. Developers are also described, for example, in Yamasue, U.S. Pat. No. 4,259,434; Seino, U.S. Pat. No. 4,452,880; Miller, U.S. Pat. No. 5,851,735; Eckler, U.S. Pat. No. 5,998,102; Miro, EB-A-0 732 628; Toyama, GB-A-2,276,729 (DE-A-4 411 176); and Fiebag, U.S. Pat. No. 6,143,479.

The developer may be applied to the imaged layer in any suitable manner, including by brushing, wiping, rubbing or spraying. In one embodiment, the layer is developed in a Mercury Mark V Processor supplied by Kodak Polychrome Graphics. Development time may range depending on the type of developer and the composition of the layer. Suitable development time may range from 15 seconds to two minutes. Optionally, the resulting image area may be dried with hot air, oven heat or IR radiators.

The thermally sensitive composition of the present invention may be used in a variety of applications. Suitable applications include use as thermally sensitive coatings for printing plates and masks. In one example, a positive working printing plate may be formed by applying the thermally sensitive composition to an ink receptive substrate, treating the composition to form a solid layer, imagewise exposing the layer to light and then developing either the exposed or unexposed region or portion to form a hydrophilic image area and to reveal portions of the ink-receptive substrate. Alternatively, a negative working printing plate may be formed by applying the thermally sensitive composition onto a hydrophilic substrate, treating the thermally sensitive composition to form a solid layer that adheres to the substrate, imaging and developing the composition to form an image area, and then immersing the image area in a suitable conditioner to enhance the ink-receptive properties of at least part of the image area. An example of a suitable conditioner is reported in WO 90/03600 and is provided in the table below:

| Component | Amount |
| --- | --- |
| Water | 1000 ml |
| Ethoquad C25 | 6.0 g |
| Phenylmercaptotetrazole | 2.8 g |
| Cetyltrimethyl ammonium bromide | 1.5 g |
| Sodium ferric EDTA | 40.0 g |
| Potassium iodide | 5.5 g |
| Potassium thiocyanate | 1.0 g |
| Acetic acid | 20.0 ml |
| Sodium acetate | quantity resulting in pH of 4.0 |

In another example, the thermally sensitive composition may be used to form a negative working mask. The thermally sensitive composition may be applied to a transparent substrate, such as a polyester substrate, and may then be treated to form a layer. The layer may then be imagewise exposed to radiation to affect the solubility of exposed portions of the layer. The imaged layer may then be processed to form a radiation opaque pattern area. The resulting pattern area may exhibit an optical density ($d_{max}$) of greater than about 2.0, more particularly greater than about 2.5, even more particularly about 2.8. The resulting mask may be used, for example, as a mask for the selective exposure of another radiation sensitive layer of a printing plate.

The significant durability of the thermally sensitive composition to radiation exposure makes the present invention particularly suitable for use as a mask in the formation of a flexographic printing plate. Conventional flexographic printing precursors are composed of a flexible, oftentimes transparent, substrate, a photopolymerisable layer, a release layer and a coversheet. After removing the coversheet and release layer, the photopolymerisable layer may be subjected to floodwise UV exposure through a suitable mask. The photopolymerisable layer may also be subjected to a back exposure or backflash step, in which UV exposure occurs through the substrate to expose a portion of the photopolymerisable material immediately adjacent to the substrate. This backflash step may improve the adhesion between the photopolymerisable layer and the substrate, and may also establish the depth of the relief image after development. Following exposure, the photopolymerisable layer may be developed with a suitable developer to form an image.

After development, the printing plate may be post-exposed to ensure that the photopolymerization process has completed. Optionally, the plate may then be subjected to detackification, a post development treatment that may be used if the surface of the photopolymerisable layer is still tacky. Suitable detackification processes include treatment with bromine or chlorine solutions, or with radiation exposure.

In the method of the present invention, the flexographic precursor may be modified by removing the coversheet and release layer to reveal the photopolymerisable layer. The nanopaste may then be applied to the photopolymerisable layer by conventional techniques, treated to form a solid layer, imaged and then developed to form a radiation-opaque mask. The photopolymerisable layer may then be exposed to UV radiation through the mask, as well as by back exposure to improve adhesion of the photopolymerisable layer to the substrate. The imaged photopolymerisable layer may then be developed to form an image on the substrate. After development, the flexographic printing plate may be post developed and subjected to detackification as described above.

The present invention is further described in the following Examples:

EXAMPLE 1

Formation of a Lithographic Printing Plate

An aluminum sheet was coated via a wire wound bar with a layer of thermally sensitive composition composed of Ag sol (90 w/w %) and IR dye A (10 w/w %). Ag sol is an inorganic nanopaste having a metallic particle mean diameter of 11.0 nm in a 5 w/w % solution in water, which is available from ANP, Korea. IR dye A is represented by the following structure:

The thermally sensitive composition was then air dried to form a layer having a dry weight of 1.3 g/m$^2$, and then oven dried at 80° C. for 60 seconds.

A sample of the resulting layer was then imagewise exposed at 195 mJ/cm$^2$ using an internal test pattern on a Creo Trendsetter 3230, a placesetter operating at a wavelength of 830 nm and available from Creo Products Inc., Burnaby, BC, Canada. Exposure resulted in a color change from gray to copper-like. The sample was then immersed for 20 seconds in 956 developer, a phenoxyethanol based developer available from Kodak Polychrome Graphics, Norwalk Conn. The non-image areas were washed away, revealing the hydrophilic aluminum substrate layer, while the image area (corresponding to the internal test pattern) remained. The resolution of the resulting image area was at least about 2–98% at 150 lines per inch.

The image area may then be immersed in the following conditioner for 20 seconds to enhance the ink receptiveness of the image area:

| Component | Amount |
|---|---|
| Water | 1000 ml |
| Ethoquad C25 | 6.0 g |
| Phenylmercaptotetrazole | 2.8 g |
| Cetyltrimethyl ammonium bromide | 1.5 g |
| Sodium ferric EDTA | 40.0 g |
| Potassium iodide | 5.5 g |
| Potassium thiocyanate | 1.0 g |
| Acetic acid | 20.0 ml |
| Sodium acetate | quantity resulting in pH of 4.0 |

An additional sample of the plate prepared in the same way was immersed in Goldstar developer, a sodium meta-silicate developer available from Kodak Polychrome Graphics, for 20 seconds. The non-imaged areas were washed away, revealing the hydrophilic aluminum substrate. The image area remained. The image area may then be immersed in the above-described conditioner for 20 seconds to enhance the ink receptiveness of the image area.

The above experiment was also repeated using Ag/Pd sol, a nanopaste having a metallic particle mean diameter of 11.1 nm in a 5 w/w % solution in water and available from ANP. After imagewise exposure to light, the non-image areas of the coating were washed away with 956 developer, revealing the hydrophilic aluminum layer. The image area remained. The image area may then be immersed in the above-described conditioner for 20 seconds to enhance the ink receptiveness of the image area.

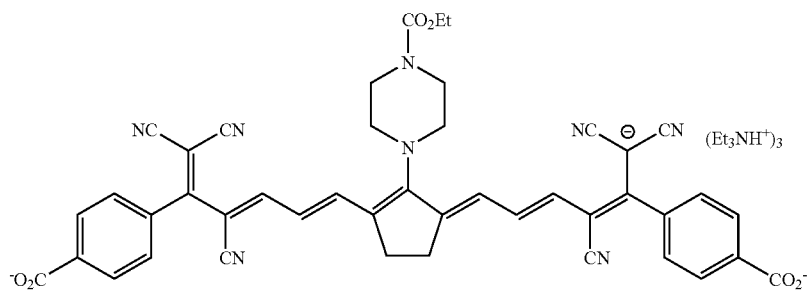

EXAMPLE 2

Formation of a Mask

A sample of unsubbed polyester sheet (4 mil thick) is coated with a layer of thermally sensitive composition composed of IR dye A (10 w/w %) and Ag sol (90 w/w %). The layer is then air dried to form a layer having a dry weight of 1.3 g/m$^2$.

A sample of the resulting layer is then imagewise exposed on a Creo Trendsetter 3230 at a wavelength of 830 nm and at 195 mJ/cm$^2$ using an internal test pattern. Exposure resulted in a color change from gray to copper-like. The sample is then immersed in 956 developer for 20 seconds. The non-image areas are washed away, revealing the polyester substrate layer, while the image area (corresponding to the internal test pattern) remains. The exposed areas remain to form an image having an optical density of greater than about 2.0.

The image is then used as a mask in the exposure of a Capricorn Gold positive working printing plate available from Kodak Polychrome Graphics. The plate (460×660×0.3 ml) is UV exposed for 600 seconds through the mask using a conventional OLIX lightframe available from OLEC. Corporation, Irvine, Calif. The imaged plate is then processed in a Mercury Mark V processor, available from Kodak Polychrome Graphics, using Goldstar developer at a processing speed of 1500 mm/minute at 24.5° C. The areas of the coating exposed to the UV light is dissolved in the developer, but the unexposed areas resist development. Thus, an accurate copy of the mask image is transferred to the plate.

A second mask sample is used in the exposure of a Vistar 360 plate negative working plate available from Kodak Polychrome Graphics. The printing plate (460×660×0.3 mm) is UV exposed for 240 seconds through the mask using a conventional OLIX lightframe. The plate is then processed in a Javin PC32 processor, a spray-on processor containing 955 developer, a benzyl alcohol based developer, both available from Kodak Polychrome Graphics. The unexposed areas of the plate coating dissolve away in the developer, but the exposed areas resist development.

EXAMPLE 3

Formation of a Mask for a Flexographic Printing Plate

A Cyrel flexographic printing plate, type 67 HLS, available from E.I. du Pont de Nemours and Company, Wilmington, Del. is obtained. A coversheet and release layer are removed from the plate to expose a photopolymerisable layer over a substrate. A nanopaste composed of Ag/Pd sol is applied onto the photopolymerisable layer, treated, exposed to IR radiation and developed as in Example 2, resulting in an image area having regions with an optical density of greater than about 2.0. The plate is then given a back flash exposure of 14 seconds on a Cyrel 3040 light source (also available from Dupont), and is given a top exposure of 2 minutes through the image area without a vacuum. The exposed element is then developed in a Cyrel rotary processor for 6 minutes using a 3:1 (vol/vol) mixture of perclene and butanol. The unexposed areas of the photopolymer layer and the image area is removed to form a relief printing plate. The printing plate is oven dried at 60° C. for one hour and is then simultaneously post exposed and finished in a Cyrel light finishing unit for five minutes. An accurate copy of the desired image is transferred to the plate.

Although Example 3 has not been performed, it has been determined that the nanopaste composition of the present invention is capable of withstanding a UV exposure time of at least 600 seconds. From this, it can be surmised that a similar mask would function successfully during the extended exposure time used in exposing the photopolymerisable layer of flexographic printing plates.

What is claimed is:

1. A mask or printing plate precursor comprising:
   a substrate; and
   a thermally sensitive composition comprising metal nanoparticles applied as a layer on at least a portion of the substrate, wherein upon imagewise exposure to thermal radiation, exposed portions of the thermally sensitive composition have a different solubility in a developer than unexposed portions of the composition.

2. The mask or printing plate precursor of claim 1 wherein the substrate comprises a metal, polymeric material, ceramic, stiff paper, or a laminate.

3. The mask or printing plate precursor of claim 1 wherein the substrate comprises aluminum.

4. The mask or printing plate precursor of 1 wherein the substrate comprises a transparent material.

5. The mask or printing plate precursor of claim 1 wherein the substrate comprises polyester.

6. The mask or printing plate precursor of claim 1 wherein the substrate comprises a flexographic printing element.

7. The mask or printing plate precursor of claim 1 wherein the substrate comprises a photopolymerisable layer.

8. The mask or printing plate precursor of claim 1 wherein the substrate is oleophilic.

9. The mask or printing plate precursor of claim 1 wherein the substrate is hydrophilic.

10. The mask or printing plate precursor of claim 1 wherein the metal nanoparticles comprise silver, palladium or a mixture of silver and palladium.

11. The mask or printing plate precursor of claim 1 wherein the metal nanoparticles comprise copper, gold, platinum, nickel or combinations thereof.

12. The mask or printing plate precursor of claim 1 wherein the metal nanoparticles have an average diameter of less than about 50 nm.

13. The mask or printing plate precursor of claim 1 wherein the metal nanoparticles have an average diameter of less than about 25 nm.

14. The mask or printing plate precursor of claim 1 wherein the metal nanoparticles have an average diameter of less than about 15 nm.

15. The mask or printing plate precursor of claim 1 wherein the metal nanoparticles have an average diameter of less than about 10 nm.

16. The mask or printing plate precursor of claim 1 wherein the thermally sensitive composition further comprises a dispersing agent.

17. The mask or printing plate precursor of claim 16 wherein the dispersing agent comprises a surfactant.

18. The mask or printing plate precursor of claim 17 wherein the surfactant is a cationic, anionic or amphoteric surfactant.

19. The mask or printing plate precursor of claim 17 wherein the surfactant is a non-ionic surfactant.

20. The mask or printing plate precursor of claim 17 wherein the surfactant comprises a perfluoroalkyl, alkylphenyl, or polysiloxane surfactant.

21. The mask or printing plate precursor of claim 17 wherein the surfactant comprises a polysiloxane polyether, polysiloxane copolymer, alkyl-aryl modified methyl-polysiloxane or acylated polysiloxane.

22. The mask or printing late precursor of claim 17 wherein the surfactant comprises sorbitan tristearate, sorbitan monopalmitate, sorbitan triolate, monoglyceride stearate or polyoxyethylene nonylphenyl ether.

23. The mask or printing plate precursor of claim 17 wherein the surfactant comprises alkyl di (aminoethyl) glycine, alkyl polyaminoethylglycine hydrochloride, 2-alkyl-n-carboxyethyl-N-hydroxyethyl imidazo inium betaine, or N-tetradecyl-N, N-substituted betaine.

24. The mask or printing plate precursor of claim 16 wherein the thermally sensitive composition comprises between about 0.05 to about 15.0 w/w % dispersing agent.

25. The mask or printing plate precursor of claim 16 wherein the thermally sensitive composition comprises between about 0.1 to about 5.0 w/w % dispersing agent.

26. The mask or printing plate precursor of claim 1 wherein the thermally sensitive composition comprises a radiation absorber.

27. The mask or printing plate precursor of claim 26 wherein the thermally sensitive composition comprises between about 0.25% to about 25 w/w % radiation absorber.

28. The mask or printing plate precursor of claim 26 wherein the radiation absorber is a dye.

29. The mask or printing plate precursor of claim 28 wherein the thermally sensitive comprises between about 0.25% to about 15 w/w % dye.

30. The mask or printing plate precursor of claim 26 wherein the radiation absorber is a pigment.

31. The mask or printing plate precursor of claim 30 wherein the thermally sensitive composition comprises between about 5% to about 25 w/w % pigment.

32. The mask or printing plate precursor of claim 26 wherein the radiation absorber comprises the structure:

33. The mask or printing plate precursor of claim 1 wherein the thermally sensitive composition further comprises a binder.

34. The mask or printing plate precursor of claim 33 wherein the binder is soluble or dispersible in substantially organic carriers.

35. The mask or printing plate precursor of claim 33 wherein the binder is soluble or dispersible in substantially aqueous carriers.

36. The mask or printing plate precursor of claim 33 wherein the binder comprises epoxy resin, modified epoxy resin, polyester resin, novolak resin, cellulose resin, copolymers of vinylidene chloride and acrylonitrile, acrylic resin, polyvinyl resin, silicone resin, polyamide resin, vinyl alcohol resin, resol resin, acetal resin, polyacrylonitrile resin, formaldehyde resin, polycarbonate resin, polyimide resin, or copolymers or derivatives thereof.

37. The mask or printing plate precursor of claim 33 wherein the binder comprises polyvinylpyrrolidone, polyvinyl alcohol, polyvinylimidazole, acrylic acid polymers, polyethyleneimine, poly(ethyloxazoline), gelatin, starches, dextrin, amylogen, gum arabic, agar, algin, carrageenan, fucoidan, laminaran, corn hull gum, gum ghatti, karaya gum, locust bean gum, pectin, guar gum, hydroxypropylcellulose, hydroxyethylcellulose, hydroxypropylmethylcellulose or carboxymethylcellulose.

38. The mask or printing plate precursor of claim 1 wherein the thermally sensitive composition is free of binders.

39. The mask or printing plate precursor of claim 1 wherein the thermally sensitive composition further comprises a humectant, biocide, viscosity builder, colorant, pH adjuster, drying agent, defoamer or a combination thereof.

40. A mask or printing plate comprising:
a substrate; and
an image area comprising metal nanoparticles adhered to a surface of the substrate.

41. The mask or printing plate of claim 40 wherein portions of the image area are hydrophilic.

42. The mask or printing plate of claim 40 wherein portions of the image area are oleophilic.

43. The mask or printing plate of claim 40 wherein portions of the image area are radiation opaque.

44. The mask or printing plate of claim 43 wherein the portions of the image area that are radiation opaque have an optical density of at least about 2.0.

45. The mask or printing plate of claim 43 wherein the portions of the image area that are radiation opaque have an optical density of greater than about 2.5.

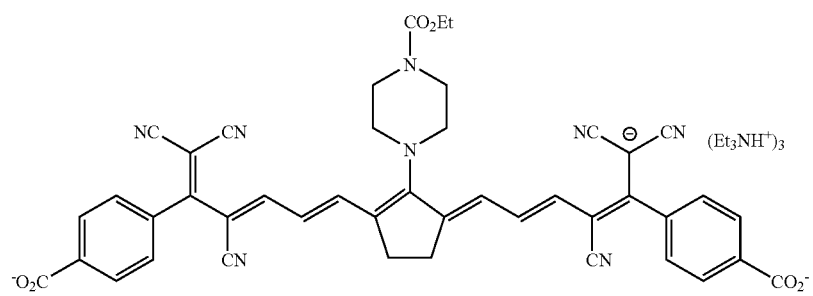

46. The mask or printing plate of claim 43 wherein the portions of the image area that are radiation opaque have an optical density between about 2.5 and about 3.0.

47. A method for forming an image on a substrate comprising:
providing a substrate;
applying onto a surface of the substrate a thermally sensitive composition comprising a nanopaste, which comprises metal nanoparticles and a carrier;
treating the thermally sensitive composition to form a layer that adheres to the surface of the substrate;
imagewise exposing the layer to radiation to affect the solubility of exposed portions of the layer relative to unexposed portions of the layer; and developing the layer to remove the exposed or unexposed portions of the layer to form an image area.

48. The method of claim 47 wherein the carrier is a substantially aqueous carrier.

49. The method of claim 47 wherein the carrier is a substantially organic carrier.

50. The method of claim 47 wherein the carrier consists essentially of water.

51. The method of claim 47 wherein the substantially aqueous carrier consists essentially of a mixture of water and a water-miscible organic liquid.

52. The method of claim 51 wherein the water-miscible liquid consists essentially of an alcohol.

53. The method of claim 47 wherein the nanopaste comprises metal nanoparticles and a substantially aqueous solution.

54. The method of claim 47 wherein the nanopaste comprises between about 0.5 and about 75 w/w % metal nanoparticles.

55. The method of claim 47 wherein the nanopaste comprises between about 0.5 and about 25 w/w % metal nanoparticles.

56. The method of claim 47 wherein the nanopaste comprises between about 0.5 and about 10 w/w % metal nanoparticles.

57. The method of claim 47 wherein the nanopaste comprises a dispersing agent.

58. The method of claim 47 wherein the thermally sensitive composition is free of binders.

59. The method of claim 47 wherein the treating step comprises air drying the layer.

60. The method of claim 47 wherein the treating step comprises oven drying the layer.

61. The method of claim 47 wherein the treating step comprises air drying and oven drying the layer.

62. The method of claim 47 further comprising heating the layer.

63. The method of claim 62 wherein heating the layer comprises heating the layer to between about 50 and 300° C.

64. The method of claim 62 wherein heating the layer comprises heating the layer to between about 50 and 150° C.

65. The method of claim 62 wherein heating the layer comprises heating the layer to about 80° C.

66. The method of claim 47 comprising enhancing the ink-receptiveness of the image area.

67. The method of claim 47 comprising applying a conditioner to the image area to enhance the ink-receptiveness of the image area.

68. The method of claim 47 wherein the conditioner comprises water, Ethoquad C25, phenylmercaptotetrazole, cetyltrimethyl ammonium bromide, sodium ferric EDTA, potassium iodide, potassium thiocyanate, acetic acid, and sodium acetate.

69. The method of claim 47 wherein exposing the layer to radiation comprises exposing the layer to IR radiation.

70. The method of claim 47 wherein developing the layer comprises developing the layer in an alkaline solution.

71. A method of forming an image on a substrate comprising:
providing a substrate;
applying onto a surface of the substrate a thermally sensitive composition comprising an inorganic nanopaste, which consists essentially of metal nanoparticles and a substantially aqueous caner;
treating the thermally sensitive composition to form a layer that adheres to the surface of the substrate;

imagewise exposing the layer to radiation to affect the solubility of exposed portions of the layer relative to unexposed portions of the layer; and
developing the layer to remove the exposed or unexposed portions of the layer to form an image area.

72. A method of making a printing plate precursor comprising:
providing a substrate;
applying onto a surface of the substrate a thermally sensitive composition comprising a nanopaste, comprising metal nanoparticles and a carrier;
treating the thermally sensitive composition to form a layer that adheres to the surface of die substrate.

73. The method of claim 72 wherein the carrier comprises a substantially aqueous carrier.

74. The method of claim 72 wherein the thermally sensitive composition is free of binders.

75. The method of claim 72 further comprising imagewise exposing the layer to radiation to affect the solubility of exposed portions of the layer relative to unexposed portions of the layer; and
developing the layer to remove the exposed or unexposed portions of the layer to form an image area.

76. The method of claim 72 wherein treating the thermally sensitive composition comprises air drying the thermally sensitive composition.

77. The method of claim 72 wherein treating the thermally sensitive composition comprises oven drying the thermally sensitive composition.

78. The method of claim 72 wherein thermally sensitive composition further comprises a radiation absorber.

79. The method of claim 72 further comprising applying a conditioner to the image area to enhance the ink-receptiveness of a portion of the image area.

80. The method of claim 72 wherein the condition comprises water, Ethoquad C25, phenylmercaptotetrazole, cetyltrimethyl ammonium bromide, sodium ferric EDTA, potassium iodide, potassium thiocyanate, acetic acid, and sodium acetate.

81. A method of making a mask precursor comprising:
providing a substrate;
applying onto a surface of the substrate a thermally sensitive composition comprising a nanopaste, which comprises metal nanoparticles and a carrier; and
treating the thermally sensitive composition to form a layer on at least a portion of the surface.

82. The method of claim 81 wherein the carrier comprises a substantially aqueous carrier.

83. The method of claim 81 wherein the thermally sensitive composition is free of binders.

84. The method of claim 81 further comprising imagewise exposing the layer to radiation to affect the solubility of exposed portions of the layer relative to unexposed portions of the layer; and
developing the layer to remove the exposed or unexposed portions of the layer to form a radiation opaque image area.

85. The method of claim 84 wherein the radiation opaque image area has an optical density of at least about 2.0.

86. The method of claim 84 wherein the radiation opaque image area has an optical density of greater than about 2.5.

87. The method of claim 84 wherein the radiation opaque image area has an optical density between about 2.5 and about 3.0.

* * * * *